United States Patent [19]

Herff

[11] 4,044,328

[45] Aug. 23, 1977

[54] DATA CODING AND ERROR CORRECTING METHODS AND APPARATUS

[75] Inventor: Anthony P. Herff, Los Angeles, Calif.

[73] Assignee: Bell & Howell Company, Chicago, Ill.

[21] Appl. No.: 698,570

[22] Filed: June 22, 1976

[51] Int. Cl.² .................................................. G06F 11/10
[52] U.S. Cl. ......................................... 340/146.1 AG
[58] Field of Search ............ 340/146.1 AG, 146.1 F, 340/146.1 R, 172.5

[56] References Cited

U.S. PATENT DOCUMENTS

| | | | |
|---|---|---|---|
| 3,183,483 | 5/1965 | Lisowski | 340/146.1 AG |
| 3,234,508 | 2/1966 | Schramel | 340/146.1 AG |
| 3,242,461 | 3/1966 | Silberg et al. | 340/146.1 AG |
| 3,387,261 | 6/1968 | Betz | 340/146.1 AG |
| 3,449,718 | 6/1969 | Woo | 340/146.1 AG |

Primary Examiner—Charles E. Atkinson
Attorney, Agent, or Firm—Benoit Law Corporation

[57] ABSTRACT

Data are modified prior to processing and are restored to their original format after processing in order to enable the detection and correction of errors that would otherwise escape detection by conventional parity checking techniques. In particular, processed data are subjected to a first parity check and to a correction of errors detected in that first parity check and modified to render further errors detectible by a parity check on the basis of which the further errors are then corrected.

72 Claims, 12 Drawing Figures

DATA CODING AND ERROR CORRECTING METHODS AND APPARATUS

BACKGROUND OF THE INVENTION

1. Field of the Invention

The subject invention relates to the field of binary data processing and, more specifically, is concerned with data encoding and decoding, parity checking and error correction, and data error detection and correction in binary and other systems in general.

2. Description of the Prior Art

Coded data processing has achieved a high level of sophistication as may, for instance, be seen from U.S. Pat. No. 3,820,083, by John L. Way, issued June 25, 1974, U.S. Pat. No. 3,764,998, by William H. Spencer, issued Oct. 9, 1973, and its U.S. Pat. No. Re. 28,257, by William H. Spencer and Brian K. Curtis, reissued Nov. 26, 1974. All these patents have been issued to the subject assignee and are herewith incorporated by reference herein.

With conventional techniques, an impasse has been reached in that it has become difficult to reduce both large and small errors below about one in ten millions and/or to increase data rates or densities without exposure to increased error rates.

SUMMARY OF THE INVENTION

It is generally an object of this invention to overcome the above mentioned disadvantages.

It is a related object of this invention to increase error detection and correction capabilities in data processing and other systems beyond current conventional limits.

It is a germane object of the invention to increase data density capabilities in data processing and other systems beyond current conventional limits.

It is a further object of the invention to provide improved data encoding and data decoding systems.

It is a further object of the invention to provide improved error detection and correction techniques and apparatus in data processing and other systems.

Other objects will become apparent in the further course of this disclosure.

In accordance with a first aspect of the subject invention, data is encoded by arranging the data in data rows, providing a first error checking signal for the arranged data, arranging that first error checking signal in a first correction row accompanying the data rows, modifying the data in the data rows and the first error checking signal by at least one data characteristic, providing a second error checking signal for the modified data and first error checking signal, arranging the second error checking signal in a second correction row accompanying the data rows and first correction row, and processing the modified data and first error checking signal and the second error checking signal in the data rows and the first and second correction rows.

In accordance with a further aspect of the subject invention, encoded data is decoded by detecting errors in the processed data with processed error checking signals, correcting detected errors in the processed data, and reversing the modification of the data in their data rows.

From a further aspect thereof, the subject invention resides in a method of correcting errors in data including errors of a first type detectible by a parity check and errors of a second type escaping detection by a parity check and, more specifically, resides in the improvement comprising in combination the steps of subjecting the data to a first parity check, correcting errors of the first type with the aid of the first parity check, modifying the data, the corrected errors of the first type and errors of the second type to render errors of the second type detectible by a second parity check, subjecting the modified data to a second parity check and correcting the modified error of the second type with the aid of the second parity check.

From a further aspect thereof, the subject invention resides in a method of correcting errors in data arranged in rows and columns and including errors confined to different rows and columns and errors located in different rows and identical columns and, more specifically, resides in the improvement comprising in combination the steps of correcting errors confined to different rows and columns, shifting the data to shift errors located in different rows and identical columns to different columns, and correcting shifted errors.

In accordance with a further aspect thereof, the subject invention resides in a method of correcting errors in data arranged in rows and columns and including errors located in the same row and different columns, and more specifically, resides in the improvement comprising in combination the steps of determining the columnar parity of the data in columns including the mentioned different columns, storing the determined columnar parity, shifting the data to shift the errors in the same row to other columns, determining the columnar parity of the shifted data in columns including the mentioned other columns, comparing the determined columnar parity of the shifted data to the stored columnar parity, and correcting errors with the aid of the mentioned comparison.

From yet a further aspect thereof, the subject invention resides in a method of correcting errors in data arranged in rows and columns and including errors detectible by row parity checks and errors detectible by column parity checks but escaping detection by row parity checks. The invention according to this aspect resides, more specifically, in the improvement comprising in combination the steps of detecting in one row an error detectible by a row parity checks, detecting further errors detectible by column parity checks but escaping detection by row parity checks, attributing said detected further errors to said one row, and effecting correction of said detected further errors in said one row.

The subject invention also resides in apparatus for carrying out the various methods of the subject invention and its preferred embodiments.

The subject invention further resides in combinations of the above mentioned aspects and in further aspects herein disclosed.

BRIEF DESCRIPTION OF THE DRAWINGS

The invention and its various aspects and objects will become readily apparent from the following detailed description of preferred embodiments thereof, illustrated by way of example in the accompanying drawings, in which like reference numerals designate like or functionally equivalent parts, and in which:

FIGS. 7 to 12 are diagrams of error detection techniques in accordance with preferred embodiments of the subject invention.

DESCRIPTION OF PREFERRED EMBODIMENTS

Figure 1:
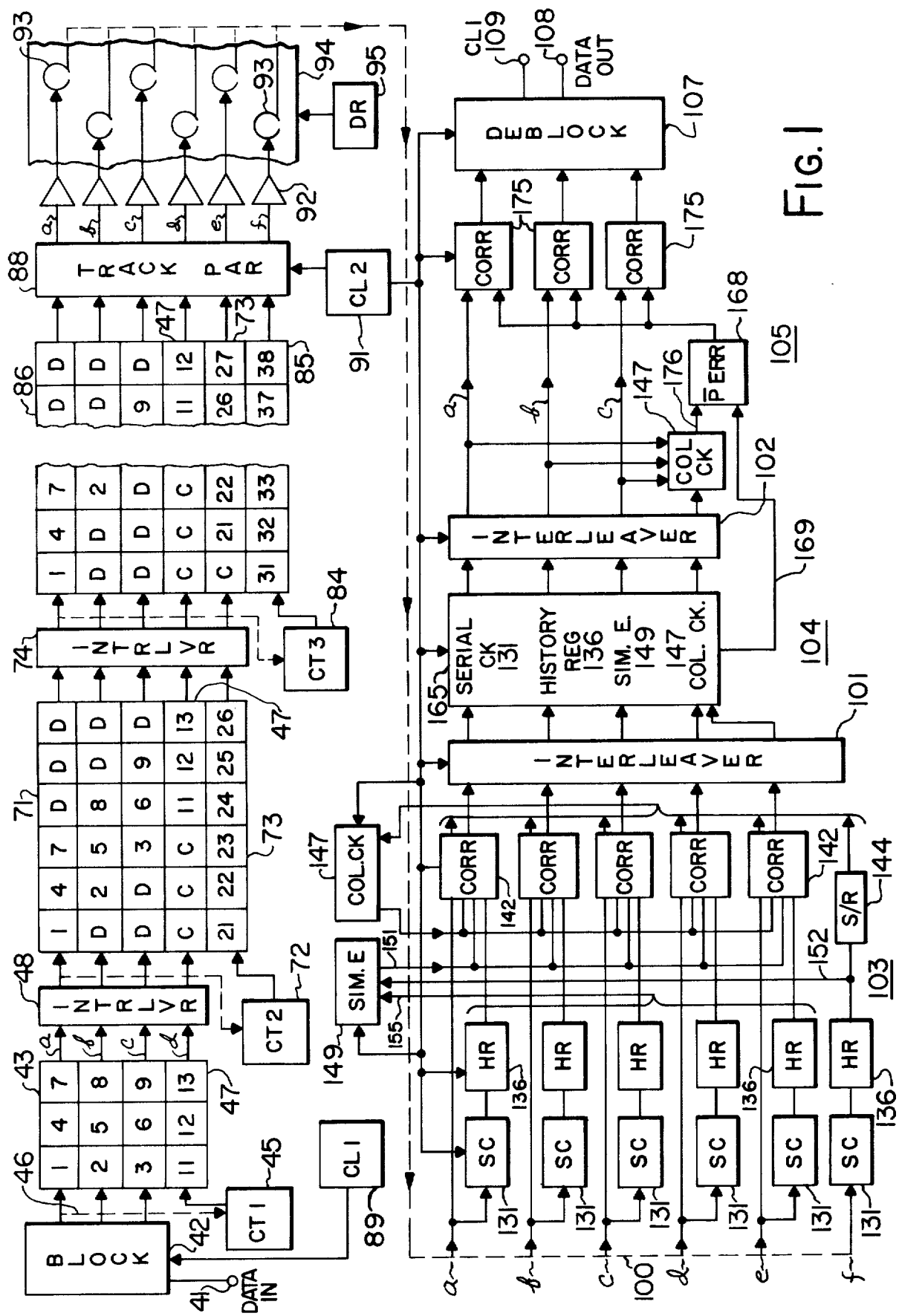
FIG. 1 is a block diagram of a data encoding, decoding and error detection and correction system in accordance with a preferred embodiment of the subject invention.

The system according to the preferred embodiment of the invention shown in FIG. 1 blocks incoming binary data received at a data input 41 into bit blocks by means of shift registers and other well-known conventional components signified by the block 42. By way of example, and not by way of limitation, a prototype of the equipment according to the subject invention blocks incoming data into seven bit blocks in twenty-four data tracks and then adds an additional check or parity bit to each seven bit word, making the "ones" in each resulting eight bit word an odd number. It will, of course, be recognized that these numbers may be varied according to particular applications and parameters and that a parity checking system based on even parities is possible.

In FIG. 1, only three data tracks or rows a, b and c have been shown for increased clarity. A diagram 43 in FIG. 1 shows data blocks 1 to 9 as distributed by the blocking equipment 42 over the three data rows and three data columns extending across or at right angles to the three data rows. In practice, each of the blocks 1 to 9 may include a plurality of words. There is then a data column for each time coincident group of single bits extending across the data tracks or rows.

The system of FIG. 1 includes a parity checker 45 which determines the parity of the bits in each data column as indicated by a dotted line 46 and inserts into a first correction row 47 parity bits as required to provide each data column across the data rows with a predetermined parity.

In principle, this predetermined parity could be odd or even, but an odd parity is presently preferred.

In this manner, a first error checking signal 11, 12, 13 et seq. is provided for the data arranged in the data rows a, b and c. As shown in FIG. 1, this first error checking signal is arranged in the first correction row 47 accompanying the data rows a, b and c.

In accordance with a preferred embodiment of the subject invention, the data arranged in data rows and the first error checking signal are now modified by at least one data characteristic. In the illustrated preferred embodiment, this is implemented by delaying the data in the data rows and the first error checking signal in the first correction row 47 by time delays which are different for different data rows and for the first correction row. To this end, the system of FIG. 1 applies the arranged data and first error checking signal to an interleaver 48 which imposes different time delays onto the data and first error checking signal in different columns. A block diagram of a suitable interleaver is shown in FIG. 5.

In particular, the interleaver imposes on each row, track or channel a predetermined time delay which is different from the delay imposed on any of the other channels. By way of example, FIG. 5 shows a straight lead between an interleaver input 52 and output 53 for the first data row, indicating that the predetermined time delay for that row is equal to zero; that is, that the interleaver 48 imposes no delay on the data in the first row a.

Figure 5:
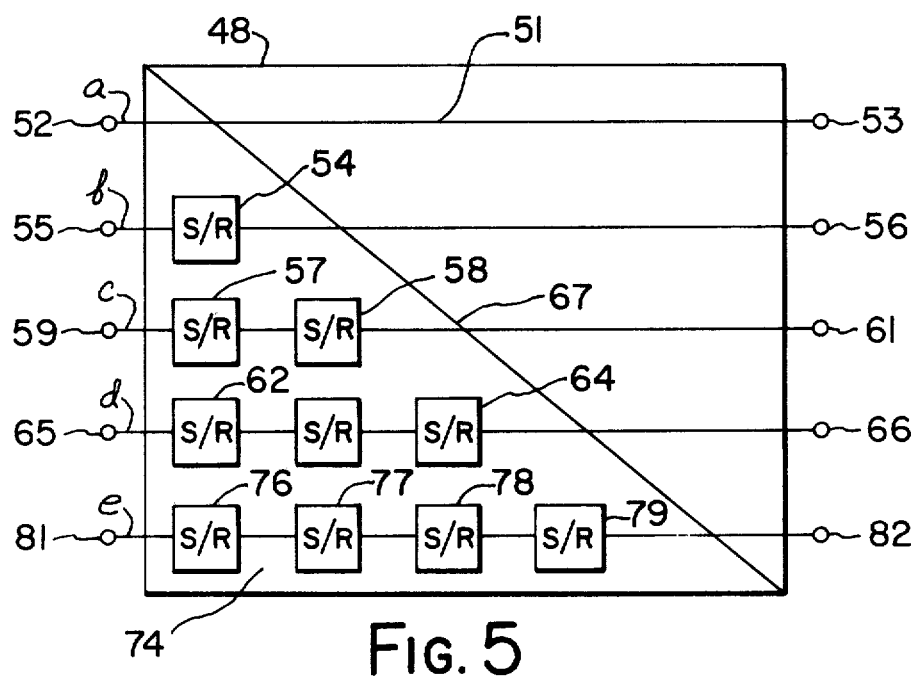

On the other hand, the interleaver according to FIG. 5 has one shift register 54 connected between the interleaver input 55 and output 56 for the second data row b, imposing one unit of a predetermined time delay.

Data in the third data row c are subjected to two units of the predetermined time delay by two shift registers 57 and 58 connected between interleaver input 59 and output 61.

The first error checking signal or bits in the first correction row 47 is delayed by three units of predetermined time delay by three shift registers 62, 63 and 64 connected in series between the interleaver input 65 and output 66 for the first correction row 47.

It will be noted with respect to FIG. 5 that the time delay imposed by the interleaver 5 could be represented by a right-angled triangle having a hypotenuse indicated in FIG. 5 at 67. However, it may be more advantageous in practice to impose the time delays or other modifications irregularly, rather than linearly, across the data and correction rows. For instance, the shift register 54 could be connected between the input 52 and output 53 so as to impose one unit of the predetermined time delay on the data in the first row a. The straight line or lead 51 could then be connected between the input 55 and output 56 to impose no delay on the data in the second row b. If this principle is followed across a large number of channels, it will be found that the error correcting capability is increased in many instances, as compared to an error correcting capability with interleavers which increase the time delays linearly across the data and error correction rows as indicated by the hypotenuse 67.

A diagram 71 in FIG. 1 shows by way of example how the blocks 1 to 9 and their corresponding data blocks D and the first error checking blocks 11 to 13 and their corresponding error correcting blocks C are shifted by the interleaver 48.

The system of FIG. 1 includes a parity checker 72 which operates equivalently to the parity checker 45, except that it determines the parity of each combined data and error signal column and provides such columnar parity bits as are required to accomplish a predetermined parity for each column leaving the interleaver 48. In this manner, the parity checker and parity generator 72 derives from the data in the data rows and from the first error checking signal in the first correction row 47, on a column-by-column basis, a second error checking signal for the data and first error checking signal modified or delayed by the interleaver 48. The parity checker or generator 72 provides such second error checking signal 21 to 26 et seq. in a second correction row 73 accompanying the data rows and first correction row as shown in the diagram 71 in FIG. 1. The data in the data rows and the error checking signal in the correction rows are applied to a second interleaver 74 which subjects the data and error checking signals to a second modification or time delay. The second interleaver 74 may be similar to the first interleaver as shown in FIG. 5. For instance, four shift registers 76, 77, 78 and 79 may be connected between an interleaver input 81 and output 82 in order to impose upon the second error checking signal a time delay which is different from the time delays imposed upon the first error checking signal or any of the data in the three data rows.

It should be understood at this juncture that the time delay units forming the basis of operation of the interleaver 74 may be different from the time delay unit forming the basis of operation of the interleaver 48. By way of example, the interleaver 47 may impose units of time delay which exceed many times the units of time delay imposed by the interleaver 48. In that case, the shift registers 54 etc. in the interleaver 74 are different from the corresponding shift registers in the interleaver 48, so as to impose longer time delays per shift register unit.

A third parity checker and signal generator 84 checks, on a column-by-column basis, the data in the three data rows and the error checking signals in the two correction rows 47 and 73 for parity and supplies parity signals to a third correction row 85 as needed to provide each combined data and error signal column across the data and correction rows with the same predetermined parity. The resulting third error checking signal is shown at 31 to 38 in the third correction row 85 which accompanies the data rows and first and second correction rows 47 and 73 in the diagram 86 in FIG. 1. As is apparent from that foreshortened diagram 86, the interleaver 74 shifts the data in the data rows and the error checking signals in the first and second error checking rows still further relative to their positions in the diagrams 71 after the first interleaver 48.

The system of FIG. 1 now prepares the modified or shifted data in the data rows, the modified or shifted error checking signals in the correction rows 47 and 73 and the third error checking signal in the correction row 85 for recording, transmission or other desired processing. As indicated by a block 88, the system of FIG. 1 determines and generates predetermined track parities.

In this respect, reference may be had to the above mentioned Way, Spencer and Curtis patents which show parity insertion, zero-crossover enhancement and parity removal equipment suitable for present purposes. In brief, the equipment 88 determines the parity for each word and generates and adds parity bits as required to provide each word with a predetermined parity. For instance, each word may be provided with an odd parity. Other known techniques for enhancing the alternating-current frequency or number of zero-crossovers in each word may also be employed. Also, further conventional techniques for improving the quality of the recording and reproduction or the transmission of the data, such as by insertion of deskew sync words, may also be employed.

As will be noted from the above mentioned patents, the data and error checking signals which up to the block 88 have been clocked at a predetermined clock rate by a clock CL1, as indicated at 89, have to be clocked at a clock rate CL2, as indicated at 91 in order to accommodate the row parity bits in addition to the row data and error checking signal bits in each data or error checking signal word.

The data and error checking signals being clocked out of the equipment 88 by the clock CL2 are amplified in each row by an amplifier 92 and are thereupon applied to a series of magnetic recording heads or other information recording devices 93 which, as shown in FIG. 1 may be arranged in a conventional odd/even track split fashion. The heads 93 record the data from the data rows and error checking signals from the correction rows on a magnetic recording tape or other information recording medium 94. The tape or medium 94 is advanced relative to the heads 93 by a drive 95 and has data and control signal tracks.

The subject invention is not intended to be limited in its application to any particular recording or processing mode. For instance, high-quality instrumentation tape transports and recording equipment may be employed in the system of FIG. 1 at 95. On the other hand, the subject invention also has utility in other data processing environments, such as, for instance, in the field of data transmission. In that case, the medium 94 may include an electrical or electromagnetic data transmission medium and the devices 93 may be data channel transmitting devices.

Equipment for receiving or reproducing the transmitted or recorded data is shown in the lower half of FIG. 1 symbolically connected by a dotted line 100, inasmuch as similar equipment as the equipment 92 to 95 may be employed for receiving or reproducing the transmitted or recorded data and error checking signals in the data and correction rows $a$ to $f$.

It is basically the purpose of the equipment of the preferred embodiment of the invention shown in the lower half of FIG. 1 to detect and correct errors in the data and error checking signals processed up to the line 100, and to reverse the modification or time delays of data and error checking signals effected by the interleavers 48 and 74.

The decoding equipment shown in the lower half of FIG. 1 has a third interleaver 101 which corresponds to the second interleaver 74 and which reverses the time delays imposed by that second interleaver so that the reproduced data, having generally the format or interrow time relationships shown by the diagram 86, are in effect restored to the format or interrow time relationships shown by the diagram 71.

The decoding apparatus shown in FIG. 1 also includes a fourth interleaver 102 which corresponds to the first interleaver 48 in reversing the modification or time delays imposed by that first interleaver. The second interleaver 102 in effect restores the data from the format shown by the diagram 71 to the format illustrated by the diagram 43.

Between the playback or receiving equipment (line 100) and the interleaver 101, the decoder of FIG. 1 also has a loop 103 for detecting errors and for correcting errors which, in the format indicated by the diagram 86, are detectible by a parity check or which are rendered detectible by equipment in the loop 103.

A loop 104 between the interleavers 101 and 102 detects further errors and corrects such further errors as are detectible by a parity check in the format illustrated by the diagram 71. The second loop 104 also cooperates with the third loop 105 in detecting errors that are not susceptible to detection by conventional parity checking techniques. Errors of the latter type are herein referred to as "non-parity-detectible errors". Such errors are observed in the format illustrated by the diagram 71 are corrected by the fourth loop 105.

The data, being now essentially in the format shown by the diagram 43, are thereupon deblocked by equipment 107 which corresponds to the blocking equipment 42 and which restores the data at a data output 108 to their original format as received by the data input 41 and which typically also provides a clock signal CL1 at a clock output 109.

Figure 6:
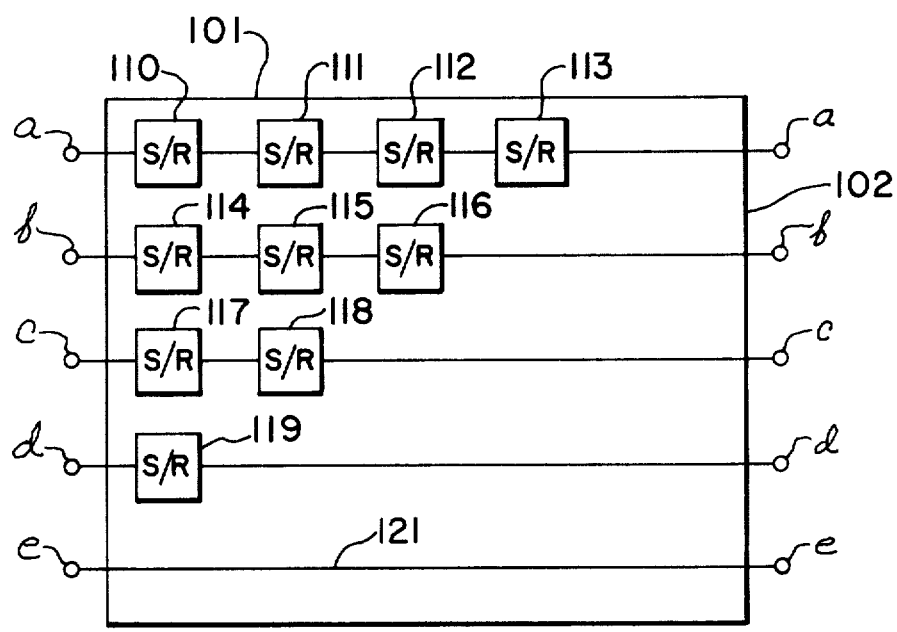

Each interleaver 101 and 102 in effect is the reverse of its corresponding interleaver 74 and 48, respectively. This may be seen in FIG. 6 where four shift registers 110 to 113 are located in the data row $a$, whereas no shift register was located at 51 in the data row *a* of the interleaver 48 or 74.

Similarly, three shift registers 114 to 116 are located in the data row *b* in the interleaver 101 or 102 as against only one shift register 54 in the *b*-row of the interleaver 48 or 74.

The central data row *c* has an equal number of shift registers 57 and 58 and 117 and 118, respectively, in the coding and decoding interleavers. The single shift register 54 in the *b*-row of FIG. 5 has its counterpart in the *d*-row of FIG. 6 at 119, whereas the straight or no-delay lead 51 in FIG. 5 has its counterpart in the e-correction row at 121 in FIG. 6. In this respect, it will be noted from FIG. 1 that this last line 121 is only needed in the interleaver 101.

Data and error checking signals received by the decoder at the level of line 100 are subjected to track or row error detection by an individual serial checker 131 for each track or row. The serial checkers effect a parity check on each word as received in the particular row. It will be recalled at this juncture that each word in our preferred example comprises, say, seven data bits and one parity bit. The type of track error detection herein employed is not capable of determining the exact bit location of an error, but is only able to determine the track which contains the error.

Figure 2:
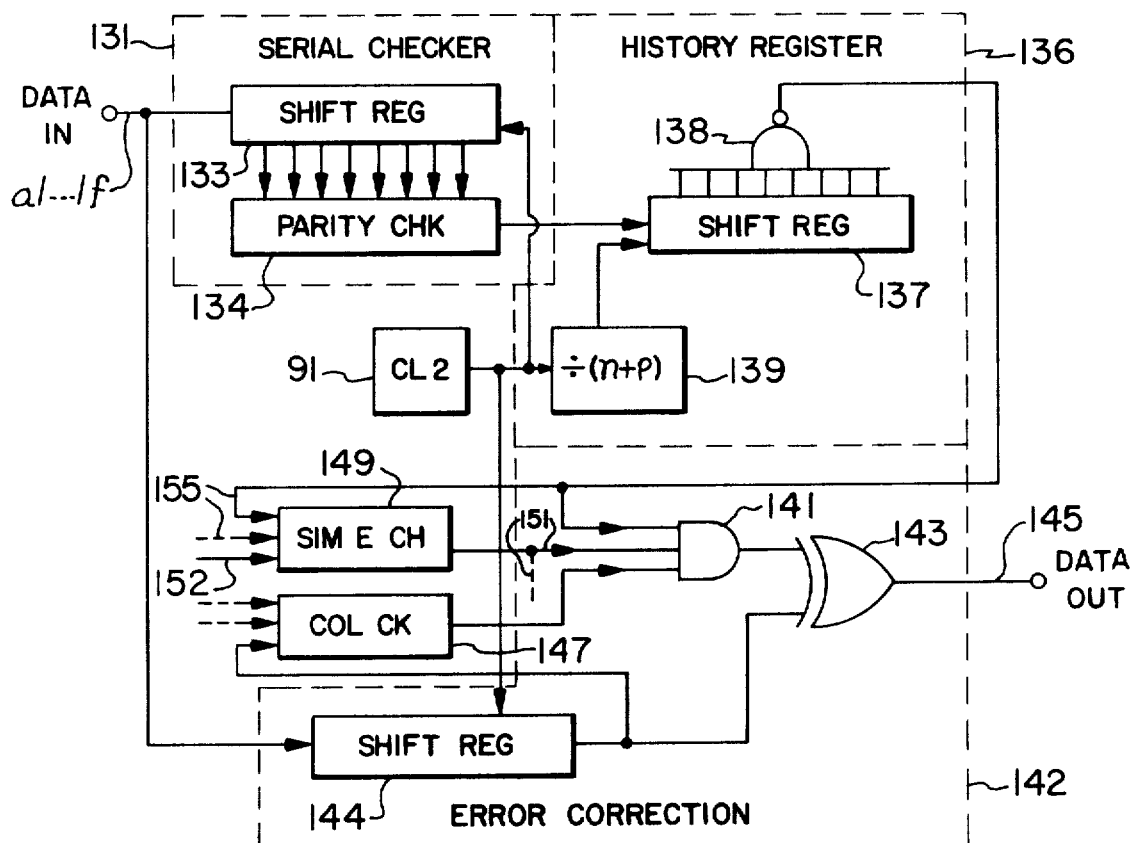
FIGS. 2 to 6 are block diagrams and schematics of details of the system of FIG. 1 in accordance with preferred embodiments of the subject invention.

As more specifically shown in FIG. 2, each serial checker 131 has a shift register 133 into which reproduced or received data or error checking signals are shifted with the aid of the clock CL2 91 in a word-for-word fashion. By way of example, the shift register 133 may be a conventional 8 bit register if the number of data and parity bits per word is equal to eight.

Each shifted word is broadsided into a parity checker 134 which may be of a conventional type, such as the type SN74180 shown, for instance, in The Integrated Circuits Catalog for Design Engineers, by Texas Instruments Incorporated, CC-401, pp. 9-309 to 314.

The output of the parity checker 134 constitutes the output of the serial checker 131 and is applied to the input of a history register 136 which comprises a shift register 137.

The shift register 137 is clocked at a rate which corresponds to the rate of the clock CL2 divided by the number of bits in each enhanced word, being equal to the sum of data and parity bits in each word $(n+P)$; wherein $n$ stands for the data bits and P for the parity bit or bits. In this manner, the result of each word parity check is shifted through the shift register 137 and applied to an input of a NAND element 138 connected to the shift register 137 in the history register 136. A block 139 indicates a counter for dividing the clock CL2 by the above mentioned divisor of $(n+P)$.

The parity checker 134 supplies the shift register 137 and thus the NAND element 138 with a binary 1 as long as no track error is detected by the serial checker 131. The NAND element 138, in turn, supplies a first input of an AND element 141 in an error correction circuit 142 with a binary 0 as long as no binary 0 appears at any of the inputs of the NAND element 138.

A binary 0 then prevails at the input of an Exclusive OR element 143 connected to the AND element 141. Data or error checking bits received in the particular track or row with which the serial checker, history register and error correction circuit under consideration are associated, are shifted into a shift register 144 by the clock CL 2 and are further shifted to the second input of the Exclusive OR element 143. As long as the output of the AND element 141 remains a binary 0, the Exclusive OR element 143 passes the data or correction signals received via shift register 144 to a data or correction signal output 145 connected to the corresponding track of the interleaver 101.

That interleaver 101 then passes the uncorrected data on to the second loop 104 after reversal of the time delay imposed by the interleaver 74. In this respect, it will of course be understood that the shift registers in the interleavers 101 and 102 (see FIG. 6) impose time delays which are somewhat different from the time delays imposed by the shift registers in the interleavers 48 and 74, because of the fact that the above mentioned insertion of serial parity bits necessitates a shifting by the clock CL2 in the decoder as distinguished from a shifting by the clock CL1 in the encoder up to the circuit 88. With further reference to FIG. 2, a column checker 147 has inputs connected to each of the shift registers 144 associated with the tracks *a* to *f*.

As its name implies, the column checker 147 checks the columnar parity of each received data column with the aid of the parity bits contained in the third error checking signal in the track *f*. To this end, the *f*-track also has a shift register 144 as shown in FIG. 1. However, the *f*-track does not have an error correction circuit associated therewith, as the third error checking signal is only used in the first loop 103.

The column checker 147 may be a conventional parity checker, such as of the type mentioned above in connection with binary parity checker 134. As long as each received column has the correct parity, the column checker 147 applies a binary 0 to the AND element 141 and the received data are passed on by the Exclusive OR element 143 without correction.

On the other hand, both the NAND element 138 of the history register and the column checker 147 apply a binay 1 to the AND element 141 if an error is detected in a data word or corresponding control signal by serial and columnar parity checks. At the same time, a simultaneous error checker 149 applies a binary 1 to the AND element 141 as long as there is no error in the third error checking signal and as long as there are no two or more simultaneous errors in the data and correction tracks *a* to *f*.

As a result of these binary 1 inputs, the AND element 141 applies a binary 1 input to the Exclusive OR element 143. The Exclusive OR element 143, in turn, inverts the data or error checking signals received via the shift register 144 in response to the binary 1 supplied by the AND element 141.

Figures 7, 8, 9, 10, 11, 12:
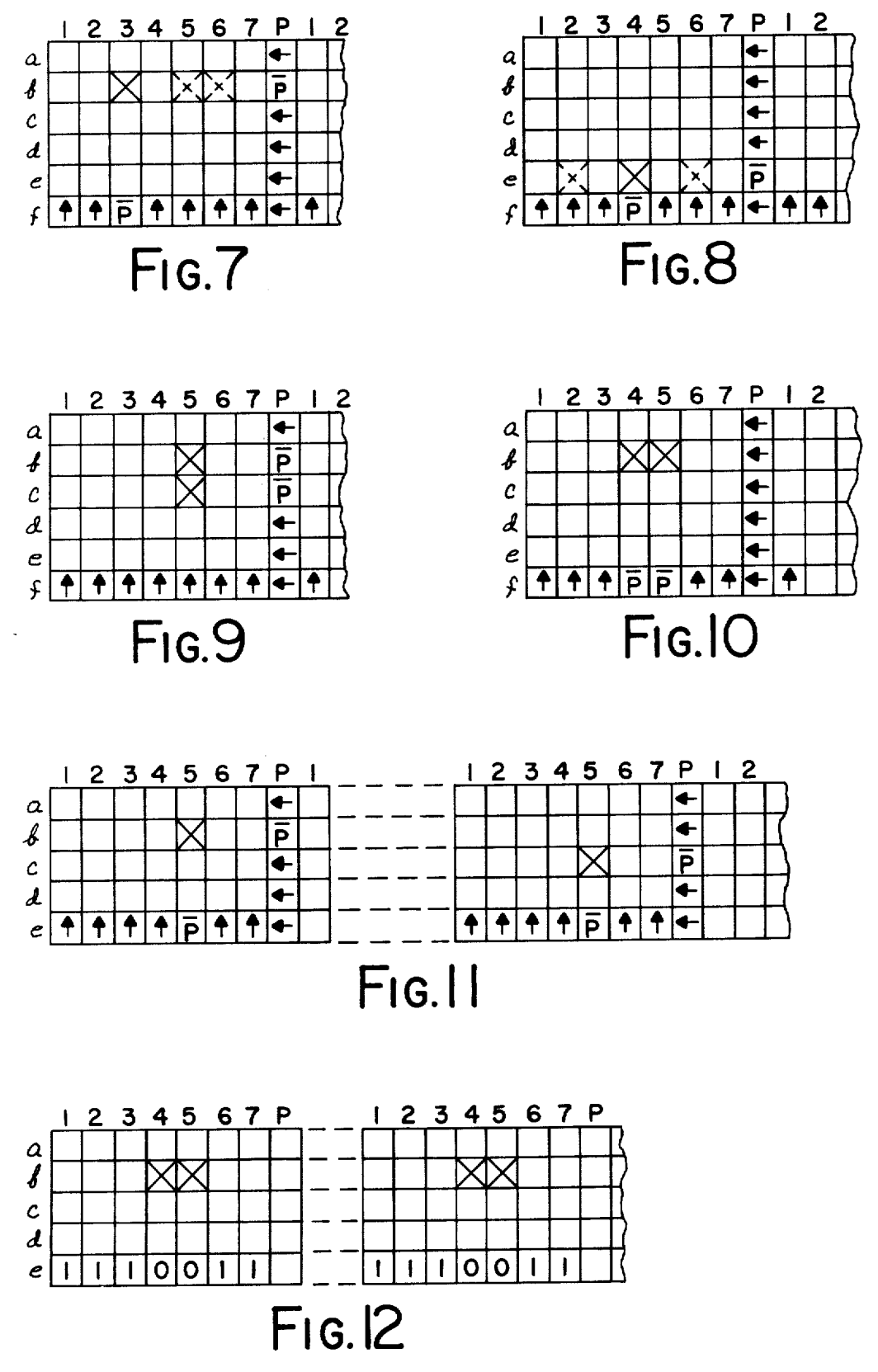

In this manner, the error correction circuits of loop 103 are capable of correcting singular errors, as may be noted with reference to FIG. 7.

In particular, FIG. 7 shows a coordinate system representing the tracks or rows *a* to *f* and word bits 1 to 7 together with a track parity bit P. The serial checking circuits 131 check in the direction of the horizontal arrows while the column checker 147 checks in the direction of the vertical arrows shown in FIG. 7. A $\bar{P}$ is flagged by the serial checkers and by the column checker in response to an error detected thereby. This translates to the above mentioned binary 1 inputs at the AND element 141 and to the resulting correction of the detected error by the Exclusive OR element 143 as mentioned above.

The correction of other errors which are detectible by a parity check is also within the purview of the preferred embodiment under consideration. In particular, if the system is an odd parity system, then the first loop 103 is able to detect and correct an odd number of errors, as indicated by dotted cross lines in addition to the previously discussed error indicated by solid cross lines in FIG. 7.

In accordance with an important feature of the illustrated preferred embodiment of the subject invention, the detection and correction of errors extends to the error signal tracks. In brief, while the encoder provides a first error signal accompanying the data in the data track and a second error signal accompanying the data and the first error signal, the decoder, after processing of the data and error signals up to the level of the line 100 shown in FIG. 1, determines the presence of errors in the processed data and two of the error signals with the aid of the further error signal, corrects errors thus determined in the processed data and error signals, and determines the presence of, and corrects, errors in the processed data with the aid of the corrected error signal or signals. By way of example, this detection and correction track such as the correction track e, is illustrated in FIG. 8.

In prior-art proposals, serious problems were caused by errors in a correction track which controlled the correcting operation. In particular, errors in a controlling error checking signal can, in turn, introduce further errors under the obscure guise of an ostensible correcting operation.

Figure 3:
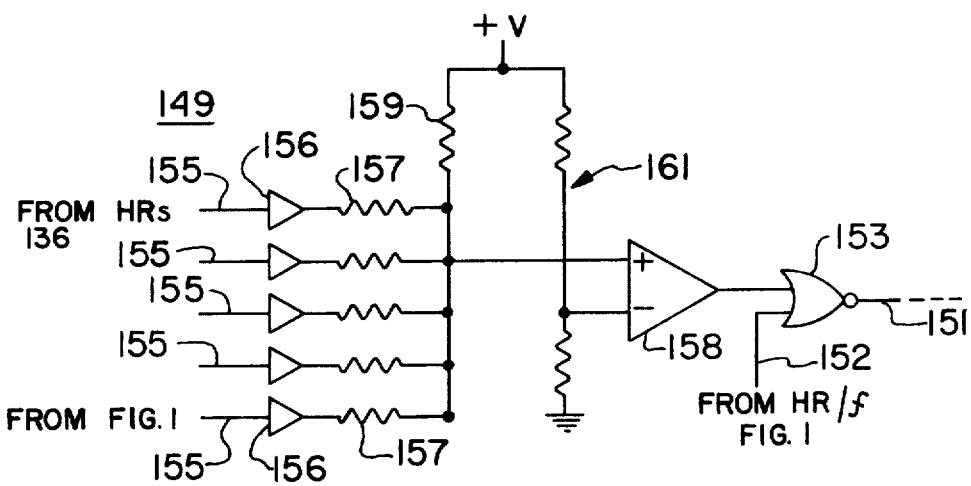

To alleviate this problem, a simultaneous error checker 149, shown in more detail in FIG. 3, issues a binary 0 via a lead 151 to the AND elements 141 of all correction circuits 142 when the components 131 and 136 detect an error in the third error checking signal in the $f$-track.

To this end, the output of the history register 136 in that $f$-track is connected via a lead 152, NOR element 153 and lead 151 to each AND element 141 in order to void or inhibit the correction function if an error occurs in the third error checking signal in the $f$-track in loop 103.

Similarly, detection and correction of simultaneous errors in the same columns are deferred to a subsequent loop. To this end, the simultaneous error checker 149 has inputs connected to the output of each history register 136 via leads 155.

As shown more specifically in FIG. 3, the simultaneous error checker 149 has a open collector buffer 156 for each lead 155 or, in other words, for each of the tracks $a$ to $e$. The outputs of the buffers 156 lead via resistors 157 to the non-inverting input of an analog voltage comparator 158. The non-inverting input of an analog voltage comparator 158. The non-inverting input of the comparator 158 is biased via a resistor 159, while the inverting input of the comparator 158 is biased via a voltage divider 161. By way of example, the analog voltage comparator 158 may be of the type 527 shown, for instance, in the Signetics Linear Integrated Circuits Catalog, by Signetics Corporation, vol. 1, (1972), pp. 109 to 112.

If any two or more of the history registers 136 flag a track error via leads 155, the voltage comparator 158 applies via element 153 and lead 151 a binary 0 to the input of the AND element 141.

In consequence, error correction by the exclusive OR element 143 is voided or inhibited and thus deferred to a subsequent loop.

One significant advantage of this procedure according to the illustrated preferred embodiment of the subject invention may be realized with the aid of FIG. 9. In particular, FIG. 9 shows how two simultaneous errors in column 5, while being detected by the serial parity check $\overline{P}$, would go undetected by the columnar parity check effected with the aid of the third error checking signal in the $f$-track. The reason for this deficiency resides in an inherent deficiency of parity checking systems which are incabable of detecting even-numbered errors in odd parity systems or in even type parity systems.

In accordance with the illustrated preferred embodiment of the subject invention, this deficiency is remedied by a combination of features including the above mentioned interleaving principle. In particular, FIG. 11 illustrates how the interleaver 101 will shift errors from the same column into completely different columns for individual inspection and correction.

Going from FIG. 9 to FIG. 11, it will be recognized how the interleaver 101 has shifted the error at $5c$ completely out of the vicinity of the error at $5b$. It should be noted at this point that the diagrams 71 and 86 in FIG. 1 are symbolic and that the contents of different data and correction rows by be shifted by dozens or hundreds of bit places in the interleaver 74, for instance.

Recapitulating this point for increased clarity, the left-hand portion of FIG. 11 shows a word into which the error at $5b$ in FIG. 9 has been shifted by the interleaver 101, while the right-hand portion of FIG. 11 shows a word into which the error at $5c$ in FIG. 9 has been shifted by the interleaver 101 because of the above mentioned different time delays imposed by the interleavers on different tracks or rows. The errors $5b$ and $5c$, having been relegated to different words, are now easily detectible and correctible in the second loop 104.

To this end, the second loop 104 contains the same equipment as the loop 103, except that the serial checker 131, history register 136 and shift register 144 of the $f$-track are omitted in the loop 104, since the third error checking signal is not carried forward into the loop 104. Rather, the second error checking signal from the $e$-track performs in the loop 104 the function performed by the third error checking in the loop 103.

In view of this essential similarity of equipment, the components 131, 136, 142, 149 and 147 and their associate parts have been shown in FIG. 1 by a block 165 as far as the second loop 104 is concerned. The simultaneous errors shown in FIG. 9 are thus corrected in the second loop 104 as shown in FIG. 11. As in loop 103 with respect to the third error signal, the second loop 104 voids or inhibits any spurious correction in response to a defective second error signal.

While only two loops 103 and 104 have been shown in FIG. 1, further loops of this type may in practice be employed depending on the magnitude of the desired correction.

A combined error correcting function of the second and third loops 104 and 105 will now be explained with the aid of FIGS. 10 and 12.

In partcular, FIG. 10 illustrates another error which cannot be detected by ordinary parity checks. It will be recalled at this juncture that an odd type parity system cannot detect an even number of errors, while an even type parity system is similarly insensitive to errors.

More specifically, the two successive track errors shown in FIG. 10 would go undetected in a conventional parity checking system. To avoid this serious drawback, a nonparity-detectible error checker 168 in effect compares the signature of the column checker prior to the interleaver 102 with the signature of the column checker after that interleaver.

In this respect, the left-hand portion of FIG. 12 shows in the e-track the binary signature obtained via a lead 169 in response to a column-by-column parity check effected with the second error signal in the second loop 104. By comparison, the right-hand side of FIG. 12 shows the same simultaneous track errors after they have been shifted by the interleaver 102. Unlike the simultaneous column errors of FIG. 9, the simultaneous track errors of FIG. 10 are not separated as illustrated for the column errors in FIG. 11, but remain together despite the operation of the interleaver 102, as may be seen in the right-hand portion of FIG. 12.

The first error signal or d-track in the right-hand portion of FIG. 12 also shows the signature of the columnar parity check as derived with the aid of the first error signal and column checker 147 after the interleaver 102.

It will thus be recognized from FIG. 12 that a comparison of the two signatures in the e and d-tracks will permit the simultaneous track error to be determined by the component 168 and corrected by correction circuits 175.

Figure 4:
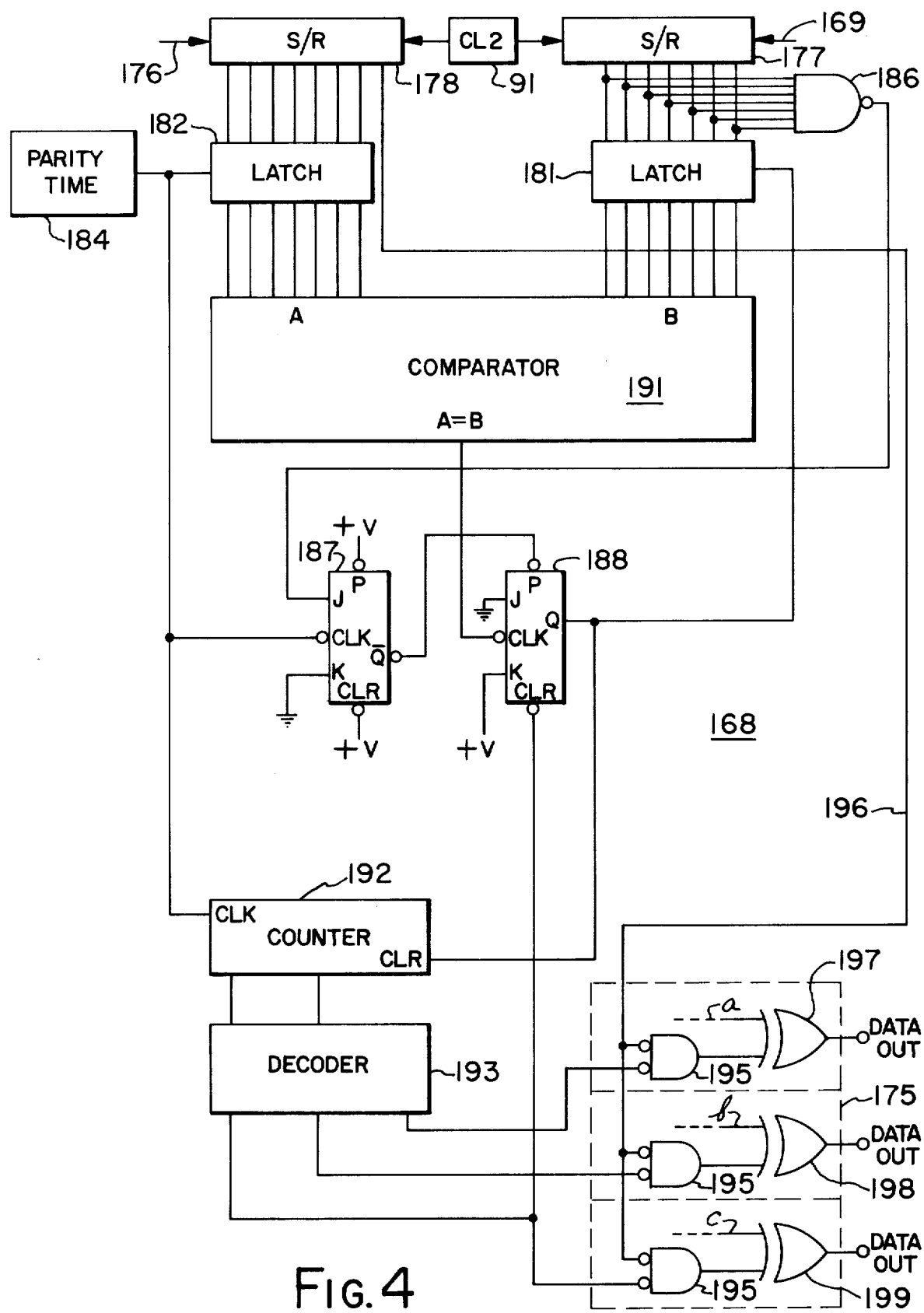

While the principle just disclosed may obviously be implemented by various circuits, a preferred embodiment of the component 168 has been shown in FIG. 4.

In particular, the results of the column parity checks in the second loop 104 and of the column parity checks in the third loop 105 are clocked into shift registers 177 and 178 via leads 169 and 176. The contents of the shift registers 177 and 178 are broadsided into latches 181 and 182. By way of example, these latches may be of the D flip-flop type, such as the well-known type SN74LS175 made by Texas Instruments Incorporated.

The latch 182 is driven by a component 184 which clocks the latch in synchronism with the occurrence of the parity bits, as distinguished from data bits. By way of example, the parity bit determining circuitry disclosed in the above mentioned Way, Spencer and Curtis patents may be employed as the component 184.

The outputs of the shift register 177 is also applied to inputs of a NAND element 186 which, in turn, energizes the J input of a J-K flip-flop 187 which is clocked by the parity time component 184. The $\overline{Q}$ output of the J-K flip-flop 187 presets a J-K flip-flop 188, the Q output of which actuates the latch 181. By way of example, the J-K flip-flops 187 and 188 may be of the type SN74LS112 made by Texas Instruments Incorporated.

The latches 181 and 182 apply the above mentioned signatures (see FIG. 12) to A and B inputs of a comparator 191, the A = B output of which clocks the J-K flip-flop 188 when the two signatures supplied by the latches 181 and 182 are identical. By way of example, the comparator 191 may be of the type SN7485 made by Texas Instruments Incorporated and shown, for instance, in their above mentioned Integrated Circuits Catalog, pp. 0–286 to 9 ∝ 288.

A divide-by-N counter, wherein N is the number of data tracks a to c, is cleared by the Q output of the J-K flip-flop 188 and is clocked by the parity time component 184. The counter 192 drives a decoder 193 which decodes the binary input supplied by the counter 192 in terms of track number. By way of example, the decoder 193 may be of the type SN74S138 made by Texas Instruments Incorporated. The decoder 193 also clears the J-K flip-flop 188 after the last data track number has been decoded.

The track number outputs of the decoder 193 are connected to first inputs of NAND elements 195 in the correction circuits 175. A lead 196 energizes second inputs of the NAND elements 195 with the parity bit occurring in the shift register 178.

The correction circuits 175 further include Exclusive OR elements 197, 198 and 199 having first inputs connected to the outputs of the NAND elements 195 and having second inputs connected, respectively, to the tracks a, b and c in the third loop 105. The outputs of the Exclusive OR elements 197 to 199 are connected to the previously described deblocker 107 for a deblocking of the corrected data and, typically, also for a removal of parity bits, such as in the manner disclosed in the above mentioned Way, Spencer and Curtis patents.

It will thus be recognized that the third loop 105 in cooperation with the second loop 104 in effect determines the columnar parity of the data in columns including the different data and first error signal columns, stores this determined columnar parity, shifts the data with the interleaver 102 in the same row to other columns, determines the columnar parity of the shifted data in columns including the mentioned other columns, compares the determined columnar parity of the shifted data to the stored columnar parity with the aid of the comparator 191, and corrects the error with the aid of that comparison and by means of correction circuits 175 including the Exclusive OR elements 197 to 199.

In accordance with a further preferred embodiment of the subject invention, the history registers 136 perform the very important function of enabling a correction of further errors that would escape prior-art parity checking techniques.

In particular, the history register 136 will memorize for a time determined by the capacity of its shift register 137 an error which has been detected by a row parity check in the row with which the particular history register is associated. In other words, the history registers 136 will detect in one row an error detectible by a row parity check.

In terms of FIG. 2, that detected row parity error is flagged by the parity checker 134 and shifted into the shift register 137. In the particular history register 136, that detected error will be shifted along the inputs of the NAND element 138 resulting in an application of a binary 1 to the AND element 141. This condition will last as long as the flagged error is in the shift register 137 and is thus memorized by the history register 136. For instance, if the shift register 137 is an 8-bit shift register, the mentioned binary 1 condition at the AND element 141 will last for 64 bits of data or error signal received by the shift registers 133 and 144.

If during that time the column checker 147 applies a binary 1 to the AND element 141, then the condition for an application of a binary 1 to the Exclusive OR element 143 via the AND element 141 is fulfilled. Accordingly, after the parity checker 134 has detected in one row an error detectible by a row parity check and the column checker 147 has detected further errors detectible by column parity checks but escaping detection by row parity checks, the history register 136 in effect attributes these further errors detected by the column checker 147 to the one row in which the error detectible by a row parity check has been detected. The error correction circuit 142 of that row then operates through its Exclusive OR element 143 in order to effect correction of the further detected errors in that one row. The length of operation of the history register 136 in terms of successive columns may be determined by the capacity of the shift register 144 which typically has a capacity several times the capacity of the shift register 137. In this manner, it is possible for the history register 136 to look not only ahead of its operation in response to detection of a track error, but to look behind into the history preceding its operation as well. In particular, the detection by the column checker 147 of errors which are correctible with the aid of the history register includes not only the errors that are detected by the column checker 147 after detection of a track error by the parity checker 134, but also the detection and subsequent correction of errors which have preceded the detection in the particular row of errors detectible by a row parity check.

In other words, the history register enables a correction of past and future errors relative to a row error detected by the parity checker 134 and on the basis of the operation of the shift registers 137 and 144 and the column checker 147.

This feature of the illustrated preferred embodiment of the subject invention is extremely important in the detection and correction of burst errors which, in practice, often extend along a track but are not detectible by a track parity check with about 50% probability because of non-parity-detectability on an even number of errors.

As in the other situations mentioned above, the simultaneous error checker 149 will void the correction of detected further errors in the one row under consideration in response to a detection of an error detectible by a row parity check in a row separate from that one row. In other words, the simultaneous error checker 149 removes the attribution of detected column errors to the one track in which an error has been detected by a track parity check, as soon as a track parity check in another track has led to the detection of a parity error in that track. This further enhances the reliability of the inventive system by avoiding an erroneous attribution of errors to tracks in which they have not occurred.

The subject invention and its preferred embodiments thus enable an increase in reliability, speed and data density, as well as a reduction of errors by several orders of magnitude. For instance, a prototype of a preferred embodiment of the subject invention reduced errors from one per million to one per ten billions of bits.

The subject extensive disclosure will suggest or render apparent various modifications and variations within the spirit and scope of the invention to those skilled in the art.

I claim:

1. In a method of encoding data, the improvement comprising in combination the steps of:
    arranging said data in data rows;
    providing a first error checking signal for said arranged data;
    arranging said first error checking signal in a first correction row accompanying said data rows;
    modifying said data in said data rows and said first error checking signal by at least one data characteristic;
    providing a second error checking signal for said modified data and first error checking signal;
    arranging said second error checking signal in a second correction row accompanying said data rows and first correction row; and
    processing said modified data and first error checking signal and said second error checking signal in said data rows and said first and second correction rows.

2. A method as claimed in claim 1, wherein:
    said first error checking signal is derived from said data in said data rows; and
    said second error checking signal is derived from said modified data in said data rows and modified first error checking signal in said first correction row.

3. A method as claimed in claim 1, wherein:
    said first error signal is derived by providing first parity bits for data columns of said data arranged in said data rows; and
    said second error checking signal is derived by providing second parity bits for columns of said modified data and first parity bits.

4. A method as claimed in claim 1, wherein:
    said processing includes the steps of providing said modified data and first error checking signal and said second error checking signal with parity bits in said data rows and first and second correction rows.

5. A method as claimed in claim 1, wherein:
    said first error signal is derived by providing first columnar parity bits for data columns of said data arranged in said data rows;
    said second error checking signal is derived by providing second columnar parity bits for columns of said modified data and first parity bits; and
    said processing includes the steps of providing said modified data and first error checking signal and said second error checking signal with serial parity bits in said data rows and first and second correction rows.

6. A method as claimed in claim 1, wherein:
    said processing includes the step of recording on a recording medium said modified data in data tracks, said modified first error checking signal in a first control track, and said second error checking signal in a second control track.

7. A method as claimed in claim 1, wherein:
    said processing includes the steps of further modifying by at least one data characteristic said modified data in said data rows and said modified first error checking signal;
    modifying by at least one data characteristic said second error checking signal;
    providing a third error checking signal for said further modified data and further modified first error checking signal and for said modified second error checking signal; and
    arranging said third error checking signal in a third correction row accompanying said data rows and first and second correction rows.

8. A method as claimed in claim 7, wherein:
    said processing includes the step of recording on a recording medium said further modified data in data tracks, and further modified first error checking signal in a first control track, said modified second error checking signal in a second control track, and said third error checking signal in a third control track.

9. In a method of encoding data, the improvement comprising in combination the steps of:
    arranging said data in data rows;
    providing a first error checking signal for said arranged data;
    arranging said first error checking signal in a first correction row accompanying said data rows;

delaying said data in said data rows and said first error checking signal in said first correction row by time delays which are different for different data rows and for said first correction row;

providing a second error checking signal for said delayed data and first error checking signal;

arranging said second error checking signal in a second correction row accompanying said data rows and first correction row; and processing said delayed data and first error checking signal and said second error checking signal in said data rows and said first and second correction rows.

10. A method as claimed in claim 9, wherein:

said first error checking signal is derived from said data in said data rows; and said second error checking signal is derived from said delayed data in said data rows and delayed first error checking signal in said first correction row.

11. A method as claimed in claim 9, wherein:

said first error signal is derived by providing first parity bits for data columns of said data arranged in said data rows; and said second error checking signal is derived by providing second parity bits for columns of said delayed data and first parity bits.

12. A method as claimed in claim 9, wherein:

said processing includes the steps of providing said delayed data and first error checking signal and said second error checking signal with parity bits in said data rows and first and second correction rows.

13. A method as claimed in claim 9, wherein:

said first error signal is derived by providing first columnar parity bits for data columns of said data arranged in said data rows;

said second error checking signal is derived by providing second columnar parity bits for columns of said delayed data and first parity bits; and said processing includes the steps of providing said delayed data and first error checking signal and said second error checking signal with serial parity bits in said data rows and first and second correction rows.

14. A method as claimed in claim 9, wherein:

said processing includes the step of recording on a recording medium said delayed data in data tracks, said modified first error checking signal in a first control track, and said second error checking signal in a second control track.

15. A method as claimed in claim 9, wherein:

said processing includes the steps of further delaying said delayed data in said data rows and said delayed first error checking signal;

delaying said second error checking signal;

providing a third error checking signal for said further delayed data and further delayed first error checking signal and for said delayed second error checking signal; and arranging said third error checking signal in a third correction row accompanying said data rows and first and second correction rows.

16. A method as claimed in claim 15, wherein:

said processing includes the step of recording on a recording medium said further delayed data in data tracks, said further delayed first error checking signal in a first control track, said delayed second error checking signal in a second control track, and said third error checking signal in a third control track.

17. In a method of encoding and subsequently decoding data, the improvement comprising in combination the steps of:

arranging said data in data rows;

providing a first error checking signal for said arranged data;

arranging said first error checking signal in a first correction row accompanying said data rows;

modifying said data in said data rows and said first error checking signal by at least one data characteristic;

providing a second error checking signal for said modified data and first error checking signal;

arranging said second error checking signal in a second correction row accompanying said data rows and first correction row;

processing said modified data and first error checking signal and said second error checking signal in said data rows and said first and second correction rows;

detecting errors in said processed data with said processed error checking signals and correcting detected errors in said processed data; and reversing said modification of said data in said data rows.

18. In a method of encoding and subsequently decoding data, the improvement comprising in combination the steps of:

arranging said data in data rows;

providing a first error checking signal for said arranged data;

arranging said first error checking signal in a first correction row accompanying said data rows;

delaying said data in said data rows and said first error checking signal in said first correction row by time delays which are different for different data rows and for said first correction row;

providing a second error checking signal for said delayed data and first error checking signal;

arranging said second error checking signal in a second correction row accompanying said data rows and first correction row;

processing said delayed data and first error checking signal and said second error checking signal in said data rows and said first and second correction rows;

detecting errors in said processed data with said processed error checking signals and correcting detected errors in said processed data; and reversing said delay of data by time delays which are different for different data rows.

19. In a method of encoding and subsequently decoding data, the improvement comprising in combination the steps of:

arranging said data in data rows;

providing a first error checking signal for said arranged data;

arranging said first error checking signal in a first correction row accompanying said data rows;

modifying said data in said data rows and said first error checking signal by at least one data characteristic;

providing a second error checking signal for said modified data and first error checking signal;

arranging said second error checking signal in a second correction row accompanying said data rows and first correction row;

processing said modified data and first error checking signal and said second error checking signal in said data rows and said first and second correction rows;

detecting errors in said processed modified data and first error checking signal with said processed second error checking signal and correcting detected errors in said processed modified data and first error checking signal;

reversing said modification of said data and said first error checking signal to restore said data and first error checking signal to their original format in said data rows; and detecting errors in said restored data with said restored first error checking signal and correcting detected errors in said restored data.

20. In a method of encoding and subsequently decoding data, the improvement comprising in combination the steps of:

arranging said data in data rows;

providing a first error checking signal for said arranged data;

arranging said first error checking signal in a first correction row accompanying said data rows;

delaying said data in said data rows and said first error checking signal in said first correction row by time delays which are different for different data rows and for said first correction row;

providing a second error checking signal for said delayed data and first error checking signal;

arranging said second error checking signal in a second correction row accompanying said data rows and first correction row;

processing said delayed data and first error checking signal and said second error checking signal in said data rows and said first and second correction rows;

detecting errors in said processed delayed data and first error checking signal with said processed second error checking signal and correcting detected errors in said processed delayed data and first error checking signal;

reversing said delayed of said data and said first error checking signal by time delays which are different for different data rows to restore said data and first error checking signal to their original arrangement in said data rows; and detecting errors in said restored data with said restored first error checking signal and correcting detected errors in said restored data.

21. In a method of decoding data which have been encoded by:

arranging said data in data rows;

providing a first error checking signal for said arranged data;

arranging said first error checking signal in a first correction row accompanying said data rows;

modifying said data in said data rows and said first error checking signal by at least one data characteristic;

providing a second error checking signal for said modified data and first error checking signal;

arranging said second error checking signal in a second correction row accompanying said data rows and first correction row; and processing said modified data and first error checking signal and said second error checking signal in said data rows and said first and second correction rows;

the improvement comprising in combination the steps of:

detecting errors in said processed data with said processed error checking signals and correcting detected errors in said processed data; and reversing said modification of said data in said data rows.

22. A method as claimed in claim 21, wherein:

said detecting and reversing steps include:

detecting errors in said processed modified data and first error checking signal with said processed second error checking signal and correcting detected errors in said processed modified data and first error checking signal;

reversing the modification of said data and said first error checking signal to restore said data and first error checking signal to their original format in said data rows; and detecting errors in said restored data with said restored first error checking signal and correcting detected errors in said restored data.

23. In a method of decoding data which have been encoded by:

arranging said data in data rows;

providing a first error checking signal for said arranged data;

arranging said first error checking signal in a first correction row accompanying said data rows;

delaying said data in said data rows and said first error checking signal in said first correction row by time delays which are different for different data rows and for said first correction row;

providing a second error checking signal for said delayed data and first error checking signal;

arranging said second error checking signal in a second correction row accompanying said data rows and first correction row; and processing said delayed data and first error checking signal and said second error checking signal in said data rows and said first and second correction rows;

the improvement comprising in combination the steps of:

detecting errors in said processed data with said processed error checking signals and correcting detected errors in said processed data; and reversing said delay of data by time delays which are different for different data rows.

24. A method as claimed in claim 23, wherein:

said detecting and reversing steps include:

detecting errors in said processed delayed data and first error checking signal with said processed second error checking signal and correcting detected errors in said processed delayed data and first error checking signal;

reversing said delay of said data and said first error checking signal by time delays which are different for different data rows to restore said data and first error checking signal to their original arrangement in said data rows; and detecting errors in said restored data with said restored first error checking signal and correcting detected errors in said restored data.

25. In a method of correcting errors in data including errors of a first type detectible by a parity check and errors of a second type escaping detection by a parity check, the improvement comprising in combination the steps of:

subjecting said data to a first parity check;

correcting errors of said first type with the aid of said first parity check;

modifying said data, said corrected errors of said first type and said errors of said second type to render errors of said second type detectible by a second parity check;

subjecting said modified data to a second parity check; and correcting said modified errors of said second type with the aid of said second parity check.

26. In a method of correcting errors in data arranged in rows and columns and including errors of a first type detectible by a parity check and errors of a second type escaping detection by a parity check in their positions, the improvement comprising in combination:

subjecting said data to a first parity check;

correcting errors of said first type with the aid of said first parity check;

shifting said data to place errors of said second type into positions wherein they are detectible by a parity check;

subjecting said data to a second parity check; and correcting errors of said second type with the aid of said second parity check.

27. In a method of correcting errors in data arranged in rows and columns and including errors confined to different rows and columns and errors located in different rows and identical columns, the improvement comprising in combination the steps of:

correcting errors confined to different rows and columns;

shifting said data to shift errors located in different rows and identical columns to different columns; and correcting shifted errors.

28. In a method of correcting errors in data arranged in rows and columns and including errors located in the same row and different columns, the improvement comprising in combination the steps of:

determining the columnar parity of said data in columns including said different columns;

storing said determined columnar parity;

shifting said data to shift said errors in the same row to other columns;

determining the columnar parity of said shifted data in columns including said other columns;

comparing said determined columnar parity of said shifted data to said stored columnar parity; and correcting said errors with the aid of said comparison.

29. In a method of correcting errors in data arranged in rows and columns and including first errors located in different rows and identical columns and second errors located in the same row, the improvement comprising in combination the steps of:

shifting said data to shift first errors located in different rows and identical columns to different columns;

correcting said shifted first errors;

determining the columnar parity of said shifted data in columns including second errors;

storing said determined columnar parity;

further shifting said data to shift second errors to other columns;

determining the columnar parity of said further shifted data in columns including said other columns;

comparing said determined columnar parity of said further shifted data to said stored columnar parity; and correcting second errors with the aid of said comparison.

30. In a method of correcting errors in data arranged in rows and columns and including first errors confined to different rows and columns, second errors located in different rows and identical columns and third errors located in the same row, the improvement comprising in combination the steps of:

correcting first errors confined to different rows and columns;

shifting said data to shift second errors located in different rows and identical columns to different columns;

correcting shifted second errors;

determining the columnar parity of said shifted data in columns including said third errors;

storing said determined columnar parity;

further shifting said data to shift third errors to other columns;

determining the columnar parity of said further shifted data in columns including said other columns;

comparing said determined columnar parity of said further shifted data to said stored columnar parity; and correcting third errors with the aid of said comparison.

31. In a method of correcting errors in data, the improvements comprising in combination the steps of:

providing a first error signal accompanying said data;

providing a second error signal accompanying said data and said first error signal;

processing said data and first and second error signals whereby to subject said data and first and second error signals to errors;

determining the presence of errors in said processed data and first error signal with the aid of said second error signal;

correcting determined errors in said processed data and first error signal; and determining the presence of, and correcting, errors in said processed data with the aid of said corrected first error signal.

32. A method as claimed in claim 31, including the step of:

determining the presence of errors in said processed second error signal.

33. A method as claimed in claim 32, including the step of:

voiding said correction of determined errors in said processed data and first error signal in response to a determination of a presence of errors in said processed second error signal.

34. In a method of correcting errors in data arranged in rows and columns and including errors detectible by row parity checks and errors detectible by column parity checks but escaping detection by row parity checks, the improvement comprising in combination the steps of:

detecting in one row an error detectible by a row parity check;

detecting further errors detectible by column parity checks but escaping detection by row parity checks;

attributing said detected further errors to said one row; and effecting correction of said detected further errors in said one row.

35. A method as claimed in claim 34, including the step of:

voiding the correction of detected further errors in said one row in response to a detection of an error detectible by a row parity check in a row separate from said one row.

36. A method as claimed in claim 34, wherein:
said detection of further errors includes the detection of further errors which have preceded the detection in said one row of said errors detectible by a row parity check.

37. In apparatus for encoding data, the improvement comprising in combination:
first means for arranging said data in data rows;
second means connected to said first means for providing a first error checking signal for said arranged data and arranging said first error checking signal in a first correction row accompanying said data rows;
third means connected to said first and second means for modifying said data in said data rows and said first error checking signal by at least one data characteristic;
fourth means connected to said third means for providing a second error checking signal for said modified data and first error checking signal and arranging said second error checking signal in a second correction row accompanying said data rows and first correction row; and
fifth means connected to said third and fourth means for processing said modified data and first error checking signal and said second error checking signal in said data rows and said first and second correction rows.

38. Apparatus as claimed in claim 37, wherein:
said second means include means for deriving said first error checking signal from said data in said data rows; and
said fourth means include means for deriving said second error checking signal from said modified data in said data rows and modified first error checking signal in said first correction row.

39. Apparatus as claimed in claim 37, wherein:
said second means include means for deriving said first error signal by providing first parity bits for data columns of said data arranged in said data rows; and
said fourth means include means for deriving said second error checking signal by providing second parity bits for columns of said modified data and first parity bits.

40. Apparatus as claimed in claim 37, wherein:
said fifth means include means for providing said modified data and first error checking signal and said second error checking signal with parity bits in said data rows and first and second correction rows.

41. Apparatus as claimed in claim 37, wherein:
said second means include means for deriving said first error signal by providing first columnar parity bits for data columns of said data arranged in said data rows;
said fourth means include means for deriving said second error checking signal by providing second columnar parity bits for columns of said modified data and first parity bits; and
said fifth means include means for providing said modified data and first error checking signal and said second error checking signal with serial parity bits in said data rows and first and second correction rows.

42. Apparatus as claimed in claim 37, wherein:
said fifth means include means for recording on a recording medium said modified data in data tracks, said modified first error checking signal in a first control track, and said second error checking signal in a second control track.

43. Apparatus as claimed in claim 37, wherein:
said fifth means include means for further modifying by at least one data characteristic said modified data in said data rows and said modified first error checking signal and modifying by at least one data characteristic said second error checking signal and means for providing a third error checking signal for said further modified data and further modified first error checking signal and for said modified second error checking signal and for arranging said third error checking signal in a third correction row accompanying said data rows and first and second correction rows.

44. Apparatus as claimed in claim 43, wherein:
said fifth means include means for recording on a recording medium said further modified data in data tracks, and further modified first error checking signal in a first control track, said modified second error checking signal in a second control track, and said third error checking signal in a third control track.

45. In apparatus for encoding data, the improvement comprising in combination:
first means for arranging said data in data rows;
second means connected to said first means for providing a first error checking signal for said arranged data and arranging said first error checking signal in a first correction row accompanying said data rows;
third means connected to said first and second means for delaying said data in said data rows and said first error checking signal in said first correction row by time delays which are different for different data rows and for said first correction row;
fourth means connected to said third means for providing a second error checking signal for said delayed data and first error checking signal and arranging said second error checking signal in a second correction row accompanying said data rows and first correction row; and
fifth means connected to said third and fourth means for processing said delayed data and first error checking signal and said second error checking signal in said data rows and said first and second correction rows.

46. Apparatus as claimed in claim 45, wherein:
said second means include means for deriving said first error checking signal from said data in said data rows; and
said fourth means include means for deriving said second error checking signal from said delayed data in said data rows and delayed first error checking signal in said first correction row.

47. Apparatus as claimed in claim 45, wherein:
second means include means for deriving said first error signal by providing first parity bits for data columns of said data arranged in said data rows; and
first fourth means include means for deriving said second error checking signal by providing second parity bits for columns of said delayed data and first parity bits.

48. Apparatus as claimed in claim 45, wherein:

said fifth means include means for providing said delayed data and first error checking signal and said second error checking signal with parity bits in said data rows and first and second correction rows.

49. Apparatus as claimed in claim 45, wherein:

said second means include means for deriving said first error signal by providing first columnar parity bits for data columns of said data arranged in said data rows;

said fourth means include means for deriving said second error checking signal by providing second columnar parity bits for columns of said delayed data and first parity bits; and said fifth means include means for providing said delayed data and first error checking signal and said seciond error checking signal with serial parity bits in said data rows and first and second correction rows.

50. Apparatus as claimed in claim 45, wherein:

said fifth means include means for recording on a recording medium said delayed data in data tracks, said modified first error checking signal in a first control track, and said second error checking signal in a second control track.

51. Apparatus as claimed in claim 45, wherein:

said fifth means include means for further delaying said delayed data in said data rows and said delayed first error checking signal and delaying said second error checking signal and means for providing a third error checking signal for said further delayed data and further delayed first error checking signal and for said delayed second error checking signal and for arranging said third error checking signal in a third correction row accompanying said data rows and first and second correction rows.

52. Apparatus as claimed in claim 51, wherein:

said fifth means include means for recording on a recording medium said further delayed data in data tracks, said further delayed first error checking signal in a first control track, said delayed second error checking signal in a second control track, and said third error checking signal in a third control track.

53. In apparatus for encoding and subsequently decoding data, the improvement comprising in combination:

first means for arranging said data in data rows;

second means connected to said first means for providing a first error checking signal for said arranged data and arranging said first error checking signal in a first correction row accompanying said data rows;

third means connected to said first and second means for modifying said data in said data rows and said first error checking signal by at least one data characteristic;

fourth means connected to said third means for providing a second error checking signal for said modified data and first error checking signal and arranging said second error checking signal in a second correction row accompanying said data rows and first correction row;

fifth means connected to said third and fourth means for processing said modified data and first error checking signal and said second error checking signal in said data rows and said first and second correction rows;

sixth means for detecting errors in said processed data with said processed error checking signals and correcting detected errors in said processed data; and seventh means connected to said sixth means for reversing said modification of said data in said data rows.

54. In apparatus for encoding and subsequently decoding data, the improvement comprising in combination:

first means for arranging said data in data rows;

second means connected to said first means for providing a first error checking signal for said arranged data and arranging said first error checking signal in a first correction row accompanying said data rows;

third means connected to said first and second means for delaying said data in said data rows and said first error checking signal in said first correction row by time delays which are different for different data rows and for said first correction row;

fourth means connected to said third means for providing a second error checking signal for said delayed data and first error checking signal and arranging said second error checking signal in a second correction row accompanying said data rows and first correction row;

fifth means connected to said third and fourth means for processing said delayed data and first error checking signal and said second error checking signal in said data rows and said first and second correction rows;

sixth means for detecting errors in said processed data with said processed error checking signals and correcting detected errors in said processed data; and seventh means connected to said sixth means for reversing said delay of data by time delays which are different for different data rows.

55. In apparatus for encoding and subsequently decoding data, the improvement comprising in combination:

first means for arranging said data in data rows;

second means connected to said first and second means for providing a first error checking signal for said arranged data and arranging said first error checking signal in a first correction row accompanying said data rows;

third means connected to said first and second means for modifying said data in said data rows and said first error checking signal by at least one data characteristic;

fourth means connected to said third means for providing a second error checking signal for said modified data and first error checking signal and arranging said second error checking signal in a second correction row accompanying said data rows and first correction row;

fifth means connected to said third and fourth means for processing said modified data and first error checking signal and said second error checking signal in said data rows and said first and second correction rows;

sixth means for detecting errors in said processed modified data and first error checking signal with said processed second error checking signal and correcting detected errors in said processed modified data and first error checking signal;

seventh means connected to said sixth means for reversing said modification of said data and said first error checking signal to restore said data and first error checking signal to their original format in said data rows; and eighth means connected to said seventh means for detecting errors in said restored data with said restored first error checking signal and correcting detected errors in said restored data.

56. In apparatus for encoding and subsequently decoding data, the improvement comprising in combination:

first means for arranging said data in data rows;

second means connected to said first means for providing a first error checking signal for said arranged data and arranging said first error checking signal in a first correction row accompanying said data rows;

third means connected to said first and second means for delaying said data in said data rows and said first error checking signal in said first correction row by time delays which are different for different data rows and for said first correction row;

fourth means connected to said third means for providing a second error checking signal for said delayed data and first error checking signal and arranging said second error checking signal in a second correction row accompanying said data rows and first correction row;

fifth means connected to said third and fourth means for processing said delayed data and first error checking signal and said second error checking signal in said data rows and said first and second correction rows;

sixth means for detecting errors in said processed delayed data and first error checking signal with said processed second error checking signal and correcting detected errors in said processed delayed data and first error checking signal;

seventh means connected to said sixth means for reversing said delay of said data and said first error checking signal by time delays which are different for different data rows to restore said data and first error checking signal to their original arrangement in said data rows; and eighth means connected to said seventh means for detecting errors in said restored data with said restored first error checking signal and correcting detected errors in said restored data.

57. In apparatus for decoding data which have been encoded by:

arranging said data in data rows;

providing a first error checking signal for said arranged data;

arranging said first error checking signal in a first correction row accompanying said data rows;

modifying said data in said data rows and said first error checking signal by at least one data characteristic;

providing a second error checking signal for said modified data and first error checking signal;

arranging said second error checking signal in a second correction row accompanying said data rows and first correction row;

processing said modified data and first error checking signal and said second error checking signal in said data rows and said first and second correction rows; the improvement comprising in combination:

means for detecting errors in said processed data with said processed error checking signals and correcting detected errors in said processed data; and means connected to said detecting means for reversing said modification of said data in said data rows.

58. Apparatus as claimed in claim 57, wherein:

said detecting and reversing means include:

means for detecting errors in said processed modified data and first error checking signal with said processed second error checking signal and correcting detected errors in said processed modified data and first error checking signal;

means connected to said detecting means for reversing the modification of said data and said first error checking signal to restore said data and first error checking signal to their original format in said data rows; and means connected to said reversing means for detecting errors in said restored data with said restored first error checking signal and correcting detected errors in said restored data.

59. In apparatus for decoding data which have been encoded by:

arranging said data in data rows;

providing a first error checking signal for said arranged data;

arranging said first error checking signal in a first correction row accompanying said data rows;

delaying said data in said data rows and said first error checking signal in said first correction row by time delays which are different for different data rows and for said first correction row;

providing a second error checking signal for said delayed data and first error checking signal;

arranging said second error checking signal in a second correction row accompanying said data rows and first correction row; and processing said delayed data and first error checking signal and said second error checking signal in said data rows and said first and second correction rows;

the improvement comprising in combination:

means for detecting errors in said processed data with said processed error checking signals and correcting detected errors in said processed data; and means connected to said detecting means for reversing said delay of data by time delays which are different for different data rows.

60. Apparatus as claimed in claim 59, wherein:

said detecting and reversing means include;

means for detecting errors in said processed delayed error and first error checking signal with said processed second error checking signal and correcting detected errors in said processed delayed data and first error checking signal;

means connected to said detecting means for reversing said delay of said data and said first error checking signal by time delays which are different for different data rows to restore said data and first error checking signal to their original arrangement in said data rows; and means connected to said reversing means for detecting errors in said restored data with said restored first error checking signal and correcting detected errors in said restored data.

61. In apparatus for correcting errors in data including errors of a first type detectible by a parity check and errors of a second type escaping detection by a parity check, the improvement comprising in combination:

means for subjecting said data to a first parity check and correcting errors of said first type with the aid of said first parity check;

means connected to said subjecting and correcting means for modifying said data, said corrected errors of said first type and said errors of said second type to render errors of said second type detectible by a second parity check; and means connected to said modifying means for subjecting said modified data to a second parity check and correcting said modified errors of said second type with the aid of said second parity check.

62. In apparatus for correcting errors in data arranged in rows and columns and including errors of a first type detectible by a parity check and errors of a second type escaping detection by a parity check in their positions, the improvement comprising in combination:

means for subjecting said data to a first parity check and correcting errors of said first type with the aid of said first parity check;

means connected to said subjecting and correcting means for shifting said data to place errors of said second type into positions wherein they are detectible by a parity check; and means connected to said modifying means for subjecting said data to a second parity check and correcting errors of said second type with the aid of said second parity check.

63. In apparatus for correcting errors in data arranged in rows and columns and including errors confined to different rows and columns and errors located in different rows and identical columns, the improvement comprising in combination:

means for correcting errors confined to different rows and columns;

means connected to said correcting means for shifting said data to shift errors located in different rows and identical columns to different columns; and means connected to said shifting means for correcting shifted errors.

64. In apparatus for correcting errors in data arranged in rows and columns and including errors located in the same row and different columns, the improvement comprising in combination:

first means for determining the columnar parity of said data in columns including said different columns;

second means connected to said first means for storing said determined columnar parity;

third means for shifting said data to shift said errors in the same row to other columns;

fourth means connected to said third means for determining the columnar parity of said shifted data in columns including said other columns;

fifth means connected to said second and fourth means for comparing said determined columnar parity of said shifted data to said stored columnar parity; and sixth means connected to said third and fifth means for correcting said errors with the aid of said comparison.

65. In apparatus for correcting errors in data arranged in rows and columns and including first errors located in different rows and identical columns and second errors located in the same row, the improvement comprising in combination:

first means for shifting said data to shift first errors located in different rows and identical columns to different columns;

second means connected to said first means for correcting said shifted first errors;

third means connected to said first means for determining the columnar parity of said shifted data in columns including second errors;

fourth means connected to said third means for storing said determined columnar parity;

fifth means for further shifting said data to shift second errors to other columns;

sixth means connected to said fifth means for determining the columnar parity of said further shifted data in columns including said other columns;

seventh means connected to said third and sixth means for comparing said determined columnar parity of said further shifted data to said stored columnar parity; and eighth means connected to said fifth and seventh means for correcting second errors with the aid of said comparison.

66. In apparatus for correcting errors in data arranged in rows and columns and including first errors confined to different rows and columns, second errors located in different rows and identical columns and third errors located in the same row, the improvement comprising in combination:

first means for correcting first errors confined to different rows and columns;

second means connected to said first means for shifting said data to shift second errors located in different rows and identical columns to different columns;

third means connected to said second means for correcting shifted second errors;

fourth means connected to said third means for determining the columnar parity of said shifted data in columns including said third errors;

fifth means connected to said fourth means for storing said determined columnar parity;

sixth means connected to said third means for further shifting said data to shift third errors to other columns;

seventh means connected to said sixth means for determining the columnar parity of said further shifted data in columns including said other columns;

eighth means connected to said fifth and seventh means for comparing said determined columnar parity of said further shifted data to said stored columnar parity; and ninth means connected to said sixth and eighth means for correcting third errors with the aid of said comparison.

67. In apparatus for correcting errors in data, the improvements comprising in combination:

first means for providing a first error signal accompanying said data;

second means for providing a second error signal accompanying said data and said first error signal;

third means connected to said first and second means for processing said data and first and second error signals whereby to subject said data and first and second error signals to errors;

fourth means for determining the presence of errors in said processed data and first error signal with the aid of said second error signal;

fifth means connected to said fourth means for correcting determined errors in said processed data and first error signal; and sixth means connected to said fifth means for determining the presence of, and correcting, errors in said processed data with the aid of said corrected first error signal.

68. Apparatus as claimed in claim 67, including:

seventh means for determining the presence of errors in said processed second error signal.

69. Apparatus as claimed in claim 68, including:

eighth means connected to said seventh means for voiding said correction of determined errors in said processed data and first error signal in response to a determination of a presence of errors in said processed second error signal.

70. In apparatus for correcting errors in data arranged in rows and columns and including errors detectible by row parity checks and errors detectible by column parity checks but escaping detection by row parity checks, the improvement comprising in combination:

first means for detecting in one row an error detectible by a row parity check;

second means for detecting further errors detectible by column parity checks but escaping detection by row parity checks;

third means connected to said first and second means for attributing said detected further errors to said one row; and fourth means connected to said third means for effecting correction of said detected further errors in said one row.

71. Apparatus as claimed in claim 70, including:

fifth means for voiding the correction of detected further errors in said one row in response to a detection of an error detectible by a row parity check in a row separate from said one row.

72. A method as claimed in claim 70, wherein:

said second means include means for detecting further errors which have preceded the detection in said one row of said errors detectible by a row parity check.

* * * * *